(12) United States Patent
Palani et al.

(10) Patent No.: US 11,469,761 B1
(45) Date of Patent: Oct. 11, 2022

(54) CMOS FREQUENCY REFERENCE CIRCUIT WITH TEMPERATURE COEFFICIENT CANCELLATION

(71) Applicant: Mixed-Signal Devices Inc., Irvine, CA (US)

(72) Inventors: Rakesh Kumar Palani, New Delhi (IN); Shouri Chatterjee, New Delhi (IN); Sweta Agarwal, New Delhi (IN); Srikar Bhagavatula, Irvine, CA (US)

(73) Assignee: Mixed-Signal Devices Inc., Irvine, CA (US)

( * ) Notice: Subject to any disclaimer, the term of this patent is extended or adjusted under 35 U.S.C. 154(b) by 0 days.

(21) Appl. No.: 17/472,066

(22) Filed: Sep. 10, 2021

Related U.S. Application Data (60) Provisional application No. 63/077,420, filed on Sep. 11, 2020.

(51) Int. Cl.
*H03K 19/018* (2006.01)
*H03K 19/0185* (2006.01)
(Continued)

(52) U.S. Cl.
CPC ....... *H03K 19/018521* (2013.01); *H03K 5/05* (2013.01); *H03K 5/2427* (2013.01);
(Continued)

(58) Field of Classification Search
CPC ..... H03K 19/018521; H03K 19/17784; H03K 5/05; H03K 5/2427
(Continued)

(56) References Cited

U.S. PATENT DOCUMENTS 10,473,530 B2 * 11/2019 Fan ................. G04F 10/005
2002/0122285 A1   9/2002 Aoki et al.
(Continued)

OTHER PUBLICATIONS

Choi et al., "A 110 nW Resistive Frequency Locked On-Chip Oscillator with 34.3 ppm/°C Temperature Stability for System-on-Chip Designs", IEEE Journal of Solid-State Circuits, vol. 51, No. 9, Sep. 2016, pp. 2106-2118.
(Continued)

*Primary Examiner* — Tomi Skibinski
(74) *Attorney, Agent, or Firm* — KPPB LLP (57) ABSTRACT

Systems and methods for frequency reference generation are described. In an embodiment, a frequency reference circuit, includes: a bandgap proportional to temperature (PTAT) generator circuit that generates a bandgap PTAT current; a resistor complementary to temperature (CTAT) generator circuit that generates a resistor CTAT current; an adder that adds the PTAT current and the CTAT current to generate a constant current $I_{cons}$; a switched-resistor (switched-R) circuit that receives the constant current $I_{cons}$ and a previously generated output clock and generates an output; a bandgap voltage reference generator circuit that generates a bandgap voltage $V_{BG}$; an integrator circuit that receives the output of the switched-R circuit and the bandgap voltage $V_{BG}$ and generates an output; and a voltage-controlled oscillator (VCO) circuit that receives the output of the integrator circuit and generates a frequency reference.

16 Claims, 9 Drawing Sheets

(51) Int. Cl.
　　　*H03K 19/17784*　　(2020.01)
　　　*H03K 5/24*　　(2006.01)
　　　*H03K 5/05*　　(2006.01)
　　　*H03K 5/00*　　(2006.01)

(52) U.S. Cl.
　　　CPC .................. *H03K 19/17784* (2013.01); *H03K 2005/00143* (2013.01)

(58) Field of Classification Search
　　　USPC ........................................................ 327/539
　　　See application file for complete search history.

(56) References Cited

U.S. PATENT DOCUMENTS

| | | |
|---|---|---|
| 2003/0137357 A1 | 7/2003 | Ye et al. |
| 2004/0189417 A1 | 9/2004 | Fujita |
| 2006/0262623 A1 | 11/2006 | Sutardja |
| 2010/0271144 A1 | 10/2010 | Mccorquodale et al. |
| 2011/0128080 A1 | 6/2011 | Wennekers et al. |
| 2011/0267150 A1 | 11/2011 | Fan et al. |
| 2011/0316595 A1 | 12/2011 | Bolton |
| 2012/0098045 A1 | 4/2012 | Tian et al. |
| 2013/0113533 A1 | 5/2013 | Aaltonen et al. |
| 2014/0247095 A1 | 9/2014 | Edwards et al. |
| 2016/0164529 A1 | 6/2016 | Nakamura et al. |

OTHER PUBLICATIONS

Choi et al., "A 99nW 70.4kHz Resistive Frequency Locking On-Chip Oscillator with 27.4ppm/°C Temperature Stability", Symposium on VLSI Circuits (VLSI Circuits), Kyoto, Japan, Jun. 17-19, 2015, pp. C238-C239.

Gürleyük et al., "A CMOS Dual-RC Frequency Reference With ±200-ppm Inaccuracy From -45 °C to 85 °C", IEEE Journal of Solid-State Circuits, vol. 53, No. 12, Dec. 2018, 10 pgs.

Liu et al., "A 2.5 ppm/°C 1.05-MHz Relaxation Oscillator With Dynamic Frequency-Error Compensation and Fast Start-Up Time", IEEE Journal of Solid-State Circuits, vol. 54, No. 7, Jul. 2019, First Published: May 3, 2019, pp. 1952-1959, DOI: 10.1109/JSSC.2019.2911208.

Long, "Phase Locked Loop Circuits", UCSB/ECE Department, Apr. 27, 2005, 46 pgs.

Razavi, "Challenges in the Design High-Speed Clock and Data Recovery Circuits", IEEE Communications Magazine, vol. 40, No. 8, Aug. 2002, pp. 94-101.

Zhang et al., "A 3.2 ppm/°C Second-Order Temperature Compensated CMOS On-Chip Oscillator Using Voltage Ratio Adjusting Technique", IEEE Journal of Solid-State Circuits, vol. 53, No. 4, Apr. 2018, First Published Dec. 4, 2017, pp. 1184-1191, DOI: 10.1109/JSSC.2017.2772808.

* cited by examiner

| Ref | Tech (nm) | Power (uW) | Freq (MHz) | Supply (V) | Tempco ppm/C | Temp Range C | FOM (dB) |
|---|---|---|---|---|---|---|---|
| [1] | 350 | 14000 | 5.05 | 3.3 | 1.7 | 0 to 80 | 172.4 |
| [2] | 180 | 775 | 1.59 | 1.8 | 2.5 | -45 to 85 | 176.7 |
| [3] | 180 | 386 | 0.17 | 1.8 | 3.2 | -40 to 150 | 186 |
| [4] | 65 | 69 | 0.051 | 1 | 4.3 | -15 to 55 | 173.9 |
| [5] | 130 | 0.15 | 0.25 | 1 | 5 | 20 to 40 | 184.3 |
| This work | 28 | 1244 | 3.762 | 1.8 | 11.5 | -40 to 125 | 196.4 |

FIG. 9

CMOS FREQUENCY REFERENCE CIRCUIT WITH TEMPERATURE COEFFICIENT CANCELLATION

CROSS-REFERENCE TO RELATED APPLICATIONS

This application claims priority to U.S. Provisional Application No. 63/077,420 entitled "CMOS Frequency Reference Circuit with Temperature Coefficient Cancellation" to Palani et al., filed Sep. 11, 2020, the disclosure of which is herein incorporated by reference in its entirety.

FIELD OF THE INVENTION

The present invention generally relates to systems and methods for frequency reference generation and, and more specifically, to CMOS frequency reference circuits with temperature coefficient cancellation.

BACKGROUND

System clocks and frequency references are employed widely in analog, mixed-signal and RF applications. Accurate frequency references can use crystal and/or acoustic wave resonators in order to generate a stable clock. These crystals can use piezoelectric materials and can be bulky and not suitable for direct integration into standard integrated circuit (IC) processes. Frequency reference applications generally need a reference that is stable over temperature. Many current frequency references fabricated using CMOS processes utilize calibration processes after the completion of IC fabrication in order to obtain a low temperature coefficient. This can lead to higher costs for the IC. Temperature coefficient of a frequency reference is a specification that describes the reference's frequency variations over a given change in temperature. The frequency reference is considered to have a low temperature coefficient when the value of the temperature coefficient is below approximately 20-30 parts per million (ppm) per degree Celsius.

When describing semiconductor devices, a relationship between the flow of electric current and the electrostatic potential across a p-n junction depends on a characteristic voltage called the thermal voltage $V_T$. The thermal voltage depends on absolute temperature T. The thermal voltage $V_T$ is defined by:

$$V_T = kT/q$$

Where: q is the charge of an electron. Its value is $1.602 \times 10^{-19}$ C.

k is Boltzmann's constant. Its value is $1.3807 \times 10^{-23}$ joules/deg K.

T is absolute temperature in Kelvin.

At room temperature, the value of $V_T$ is approximately 26 mV.

A band-gap reference voltage generator generates a reference voltage $V_{bg}$ by adding a base-emitter voltage $V_{BE}$ of a bipolar transistor which has its base and collector terminals connected, and a thermal voltage $V_T$ generator which is capable of generating a voltage proportional to a constant "kT". The $V_T$ generation can be achieved by generating a voltage $V_{BE}$ difference between two bipolar transistors, such that it minimizes a temperature coefficient using an equation denoted by $V_{bg} = V_{BE} + kV_T$.

BRIEF SUMMARY OF THE INVENTION

Systems and methods for frequency reference generation and, and more specifically, to CMOS frequency reference circuits with temperature coefficient cancellation are described. In an embodiment, a frequency reference circuit includes: a bandgap proportional to temperature (PTAT) generator circuit that generates a bandgap PTAT current; a resistor complementary to temperature (CTAT) generator circuit that generates a resistor CTAT current; an adder that adds the PTAT current and the CTAT current to generate a constant current $I_{cons}$; a switched-resistor (switched-R) circuit that receives the constant current $I_{cons}$ and a previously generated output clock and generates an output; a bandgap voltage reference generator circuit that generates a bandgap voltage $V_{BG}$; an integrator circuit that receives the output of the switched-R circuit and the bandgap voltage $V_{BG}$ and generates an output; and a voltage-controlled oscillator (VCO) circuit that receives the output of the integrator circuit and generates a frequency reference.

In a further embodiment, the bandgap PTAT and resistor CTAT currents are given by:

$$I_{PTAT} = \frac{k \cdot T \cdot \ln(N)}{q \cdot R}, \quad I_{CTAT} = \frac{V_{BG}}{\beta R}$$

where $\beta$ is ratio of resistors used in the bandgap PTAT generator circuit, N is ratio of areas of two bipolar transistors used in the bandgap PTAT generator circuit, k is Boltzmann constant, q is the charge of an electron and $V_{BG}$ is the bandgap voltage.

In a further embodiment, the bandgap PTAT current and the resistor CTAT currents are added together to generate the constant current $I_{cons}$ by:

$$I_{cons} = \frac{V_{BG}}{\beta \cdot R_0} \cdot \frac{1 + \frac{\beta \cdot k \cdot T \cdot \ln(N)}{q \cdot V_{BG}}}{1 + \alpha \cdot T}$$

such that the resistor temperature coefficient ($\alpha$) is equated to $$\frac{\beta \cdot k \cdot \ln(N)}{q \cdot V_{BG}},$$

such that the current is constant with temperature, and wherein $I_{cons}$ is independent of process, voltage, and temperature variations.

In a further embodiment again, the switch-R circuit further includes two capacitors that are ping ponged at a frequency f that is generated by the VCO.

In a further embodiment again still, a voltage generated by the switched-R circuit is constantly compared with $V_{BG}$, and an error signal is generated and is integrated and fed as a control signal to the VCO, where the VCO frequency sweeps until the error signal reaches zero.

In still a further embodiment, the frequency is given by:

$$f = \frac{1}{2 \cdot \beta \cdot R_0 \cdot C_{mos}}$$

where the frequency temperature coefficient depends on capacitor $C_{mos}$ temperature coefficient.

In still a further embodiment, the bandgap voltage reference generator circuit includes an opamp.

In still a further embodiment, a current mismatch error in a bandgap current mirror is addressed by Dynamic Element Matching.

DETAILED DESCRIPTION OF THE DRAWINGS

Turning now to the drawings, CMOS frequency reference circuits with temperature coefficient cancellation in accordance with various embodiments of the invention are illustrated. In many embodiments, a CMOS frequency reference circuit can be implemented using direct integration of on-chip oscillators, which can provide for a fully integrated system-on-chip (SoC), thus reducing overall device volume and costs. In this way, CMOS frequency reference circuit with temperature coefficient cancellation can be utilized within a variety of circuits and systems including (but not limited to) phase locked loop (PLL) circuits.

Existing on-chip frequency references may employ look-up table methods or voltage ratio techniques, where extensive post-silicon trimming can be required in order to achieve stability of the frequency reference over temperature variations. As can readily be appreciated, such techniques can increase the time and cost associated with fabrication due to the additional expense of performing the requisite trimming processes. Furthermore, the resulting circuits can have a temperature coefficient of 100 ppm/° C. As is discussed further below, CMOS frequency reference circuits with temperature coefficient cancellation implemented in accordance with various embodiments of the invention can achieve significantly lower temperature coefficients (e.g. 12 ppm/° C.).

In many embodiments, a CMOS frequency reference circuit with temperature coefficient cancellation can convert a constant current to a frequency reference by utilizing a frequency locked loop (FLL). In several embodiments, a CMOS frequency reference circuit with temperature coefficient cancellation can be implemented using active circuits including a bandgap voltage reference used in a proportional to temperature (PTAT) circuit, an integrator circuit, a voltage-controlled oscillator (VCO) circuit, and passive circuits including a switched resistor (switched-R) circuit and a complimentary to temperature (CTAT) circuit. In a number of embodiments, the CMOS frequency reference circuit with temperature coefficient cancellation can generate PTAT and CTAT currents. In several embodiments, the PTAT and CTAT currents are utilized to generate a constant current. In many embodiments, a CMOS frequency reference circuit with temperature coefficient cancellation can also employ a bandgap voltage reference generator to obtain a low temperature coefficient. In certain embodiments, CTAT and PTAT currents can be generated and added together to generate a constant current. In various embodiments, the constant current and a previously generated output clock signal can be fed into a switched-R circuit. The output of the switched-R circuit can be input into an integrator circuit. The output of the integrator circuit can be fed into a VCO, where a frequency reference is generated. In many embodiments, the CMOS frequency reference circuit with temperature coefficient cancellation can be fabricated using a 180 nm CMOS process technology. Various CMOS frequency reference circuits with temperature coefficient cancellation and applications in accordance with certain embodiments of the invention are discussed further below.

Frequency Reference Circuits

Figure 1:
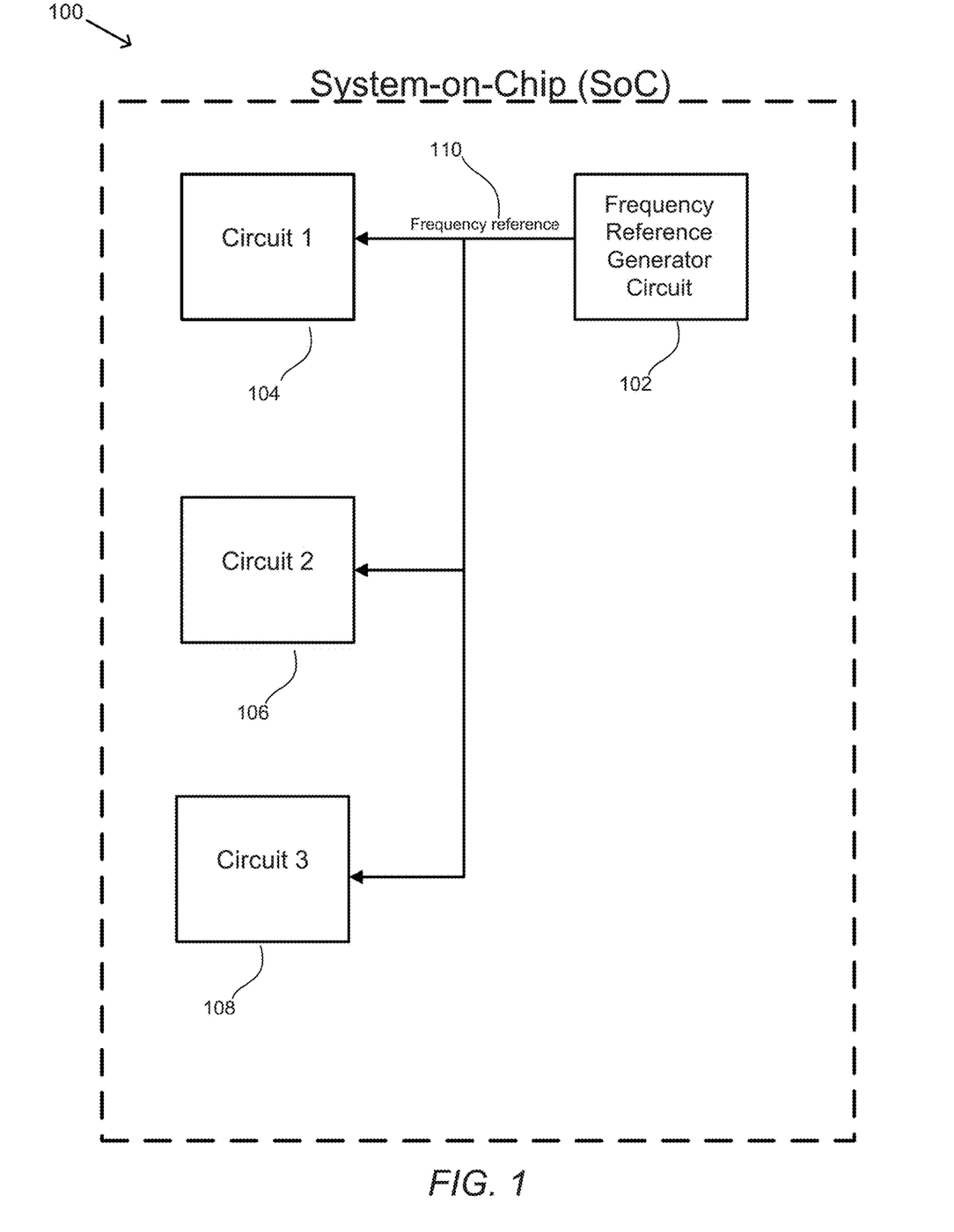
FIG. 1 conceptually illustrates a frequency reference circuit within a system-on-chip (SoC), capable of providing a frequency reference to various circuits within the SoC in accordance with an embodiment of the invention.

Frequency reference circuits can be utilized within a system-on-chip (SoC). A circuit diagram of a SoC 100 in accordance with an embodiment of the invention is illustrated in FIG. 1. In the illustrated embodiment, a frequency reference circuit 102 can provide a frequency reference 110 to different circuits (104, 106, 108) within the SoC 100. In the SOC 100, the frequency of the generated reference signal can have a predetermined level of frequency stability as a function of temperature. In many embodiments, implementations of frequency reference circuits can achieve low temperature coefficients (e.g. 12 ppm/° C.).

In several embodiments, the frequency reference circuit can be utilized for many different purposes, including but not limited to providing a stable frequency reference to a microprocessor, a microcontroller, a central processing unit (CPU), a graphics processing unit (GPU), a digital signal processor (DSP), and/or clocking an analog-to-digital converter (ADC), a digital-to-analog converter (DAC), a sampled-data filter, a discrete-time analog signal processor, and/or to circuits used in RF applications. As can readily be appreciated, frequency reference circuits can be utilized in any of a variety of applications in accordance with various embodiments of the invention. In many embodiments, an on-chip frequency reference circuit can be utilized to fabricate a fully integrated SoC, thus reducing overall device volume and costs.

Although various frequency reference circuits are described above with reference to FIG. 1, any of a variety of frequency references may be utilized as appropriate to the requirements of specific applications in accordance with various embodiments of the invention. Sub-circuits of CMOS frequency reference circuits with temperature coefficient cancellation are discussed further below.

Figure 2:
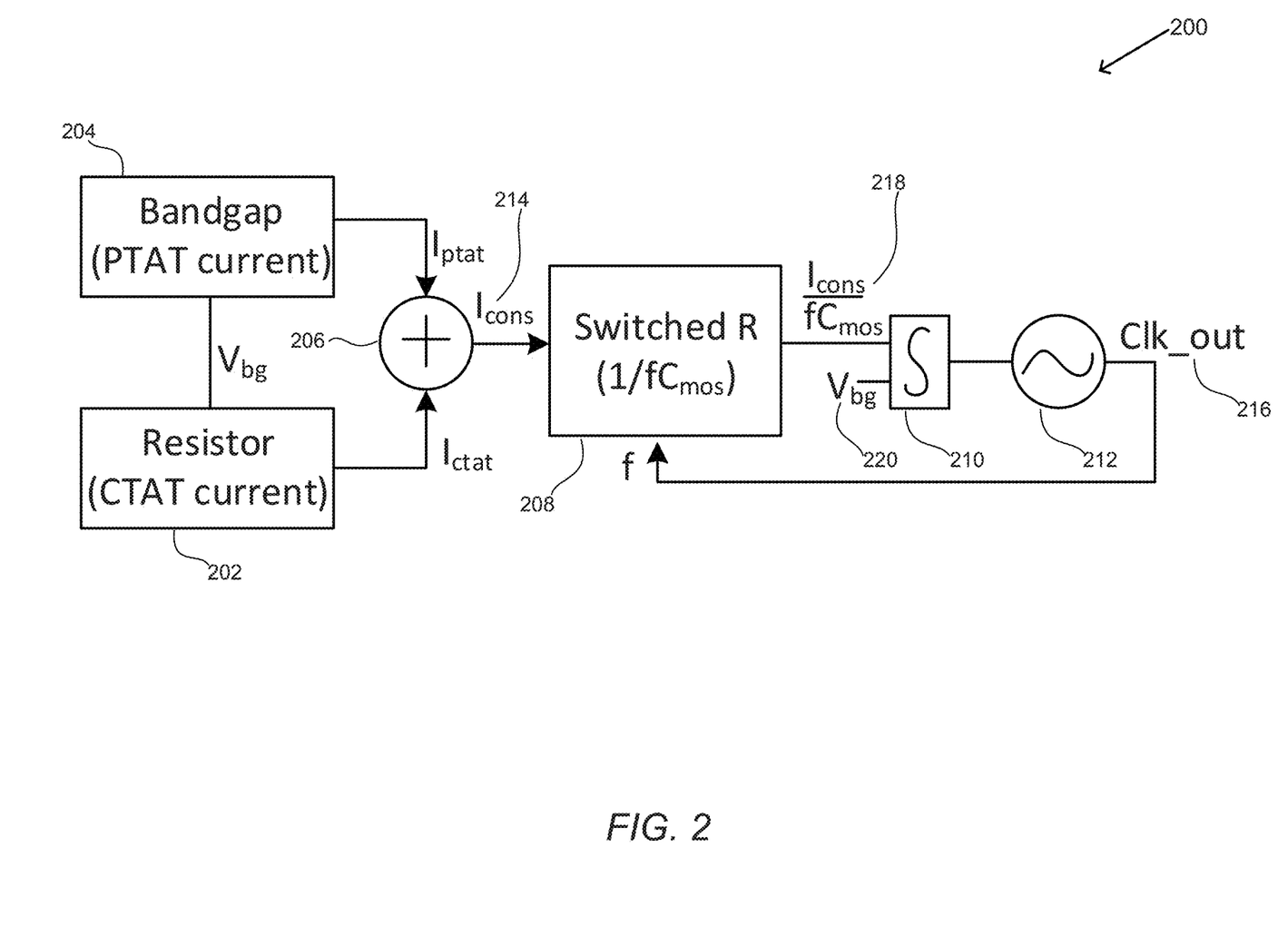
FIG. 2 is a circuit diagram of a CMOS frequency reference circuit with temperature coefficient cancellation in accordance with an embodiment of the invention.

In several embodiments, a CMOS frequency reference circuit with temperature coefficient cancellation can include a PTAT circuit, a CTAT circuit, a switched-R circuit, an integrator circuit, and a VCO circuit. A circuit diagram of a CMOS frequency reference circuit with temperature coefficient cancellation 200 in accordance with an embodiment of the invention is illustrated in FIG. 2. In the illustrated embodiment, bandgap PTAT 204 and resistor CTAT 202 currents can be generated and added together in a summing node 206 to generate a constant current 214. In various embodiments, the constant current 214 and a previously generated output clock 216 can be fed into a switched-R circuit 208. The output of the switched-R circuit 218 and a bandgap voltage 220 can be input into an integrator circuit 210. The output of the integrator circuit 210 can be fed into a VCO 212, where a frequency reference is generated.

In the illustrated embodiment, bandgap PTAT and resistor CTAT currents are given by:

$$I_{PTAT} = \frac{k \cdot T \cdot \ln(N)}{q \cdot R}, I_{CTAT} = \frac{V_{BG}}{\beta R}$$

where β is ratio of resistors used in the bandgap circuit 204, N is ratio of areas of two bipolar transistors used in the bandgap circuit 204, k is Boltzmann constant, q is the charge of an electron and $V_{BG}$ is bandgap voltage. The bandgap PTAT and the resistor CTAT currents are added together to generate a constant current $I_{cons}$:

$$I_{cons} = \frac{V_{BG}}{\beta \cdot R_0} \cdot \frac{1 + \frac{\beta \cdot k \cdot T \cdot \ln(N)}{q \cdot V_{BG}}}{1 + \alpha \cdot T}$$

By equating resistor temperature coefficient (α) to $$\frac{\beta \cdot k \cdot \ln(N)}{q \cdot V_{BG}},$$

the current will be constant with temperature. Thus, $I_{cons}$ is $$\frac{V_{BG}}{\beta \cdot R_0},$$

which is independent of process, voltage, and temperature variations.

In certain embodiments, there can be two capacitors in the switched-R circuit that are ping ponged at a frequency f, generated by VCO 212. The voltage generated by the switched-R circuit 208 is constantly compared with $V_{BG}$, and the error signal generated is integrated and fed as control signal to VCO 212. The VCO frequency keeps sweeping until the error signal reaches zero. The frequency is given by:

$$f = \frac{1}{2 \cdot \beta \cdot R_0 \cdot C_{mos}}$$

The factor 2 is due to time interleaved capacitors in the switched-R circuit. Thus, the frequency temperature coefficient depends on capacitor $C_{mos}$ temperature coefficient.

Although various CMOS frequency reference circuits with temperature coefficient cancellation are described above with reference to FIG. 2, any of a variety of CMOS frequency reference circuits with temperature coefficient cancellation may be utilized as appropriate to the requirements of specific applications in accordance with various embodiments of the invention. Methods of generating a frequency reference with temperature coefficient cancellation are discussed further below.

Figure 3:
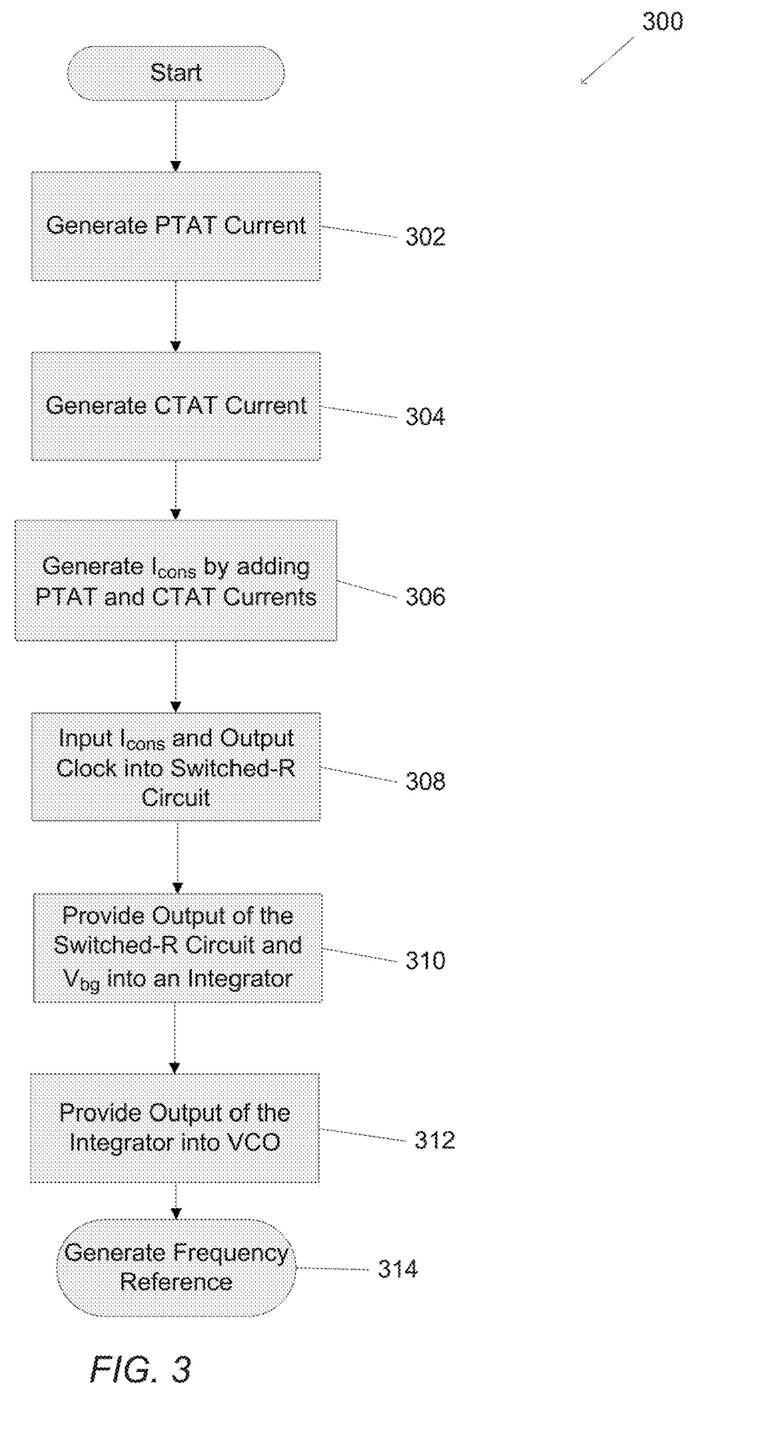
FIG. 3 is a flow diagram of a method for temperature compensated frequency reference generation in accordance with an embodiment of the invention.

A method for temperature compensated frequency reference generation in accordance with an embodiment of the invention is illustrated in FIG. 3. The method 300 includes generating (302) a PTAT current. A CTAT current is generated (304). The PTAT current and the CTAT currents can be added to generate (306) a constant current $I_{cons}$. The $I_{cons}$ and an output clock can be fed (308) into a switched-R circuit. An output of the switched-R circuit and a bandgap voltage $V_{bg}$ can be fed (310) into an integrator. The output of the integrator can be fed (312) into a VCO. The VCO can generate (314) a frequency reference.

Although various flow diagrams of methods for temperature compensated frequency reference generation are described above with reference to FIG. 3, any of a variety of methods for temperature compensated frequency reference generation may be utilized as appropriate to the requirements of specific applications in accordance with various embodiments of the invention. Detailed simulation of frequency reference circuits are discussed further below.

Figure 4:
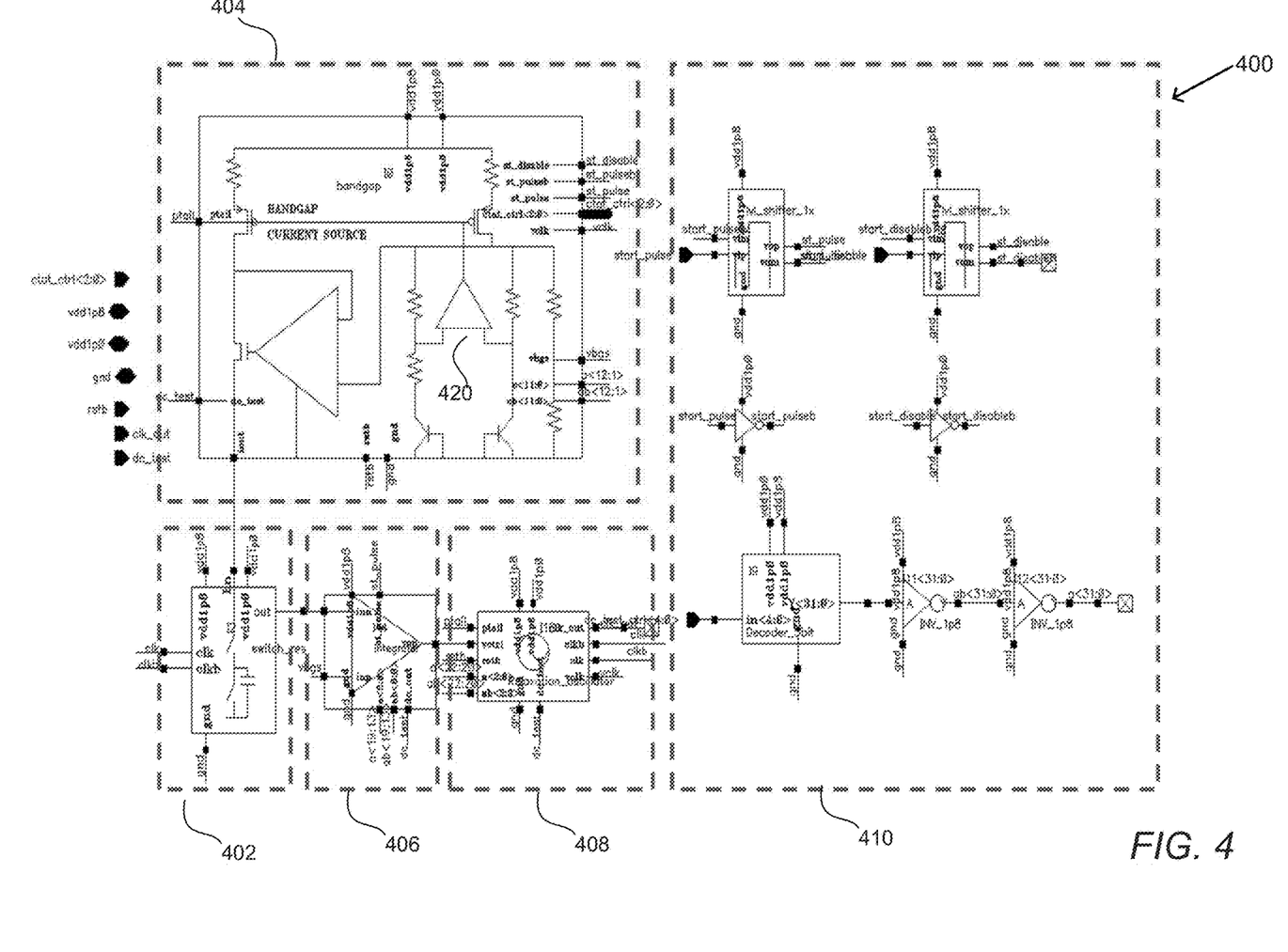
FIG. 4 is a schematic circuit diagram of a CMOS frequency reference circuit with temperature coefficient cancellation in accordance with an embodiment of the invention.

Cadence circuit simulator (Cadence Design Systems Inc, San Jose, Calif.) can be utilized to simulate the performance of CMOS frequency reference circuits with temperature coefficient cancellation. Cadence simulation circuits of a CMOS frequency reference circuit with temperature coefficient cancellation are shown in FIG. 4. In the illustrated figure, a circuit schematic 400 of a CMOS frequency reference circuit with temperature coefficient cancellation is shown. The circuit schematic 400 includes a bandgap voltage and a constant current generator 404. Further, circuit schematic 400 includes circuit schematics for a switched-R circuit 402, an integrator 406, an oscillator 408, and decoders 410. The bandgap voltage generator within circuit 404 includes an opamp 420. In existing solutions, one of the sources of error in a bandgap circuit can be an opamp offset, and current mismatch. Existing solutions address bandgap opamp offset by employing chopping techniques, which can draw 1/fC noise from the bandgap core. Further chopping can create tones and can reduce signal gain. In certain embodiments, CMOS frequency reference circuits with temperature coefficient cancellation can operate without chopping of the input differential pair of the bandgap opamp 420. The current mismatch error in the bandgap current mirror can be addressed by Dynamic Element Matching. Though the differential pair offset can still remain, its temperature coefficient can be kept zero.

Although various circuit schematics for CMOS frequency reference circuits with temperature coefficient cancellation are described above with reference to FIG. 4, any of a variety of circuit schematics may be utilized as appropriate to the requirements of specific applications in accordance with various embodiments of the invention. Circuit layouts are discussed further below.

Figure 5:
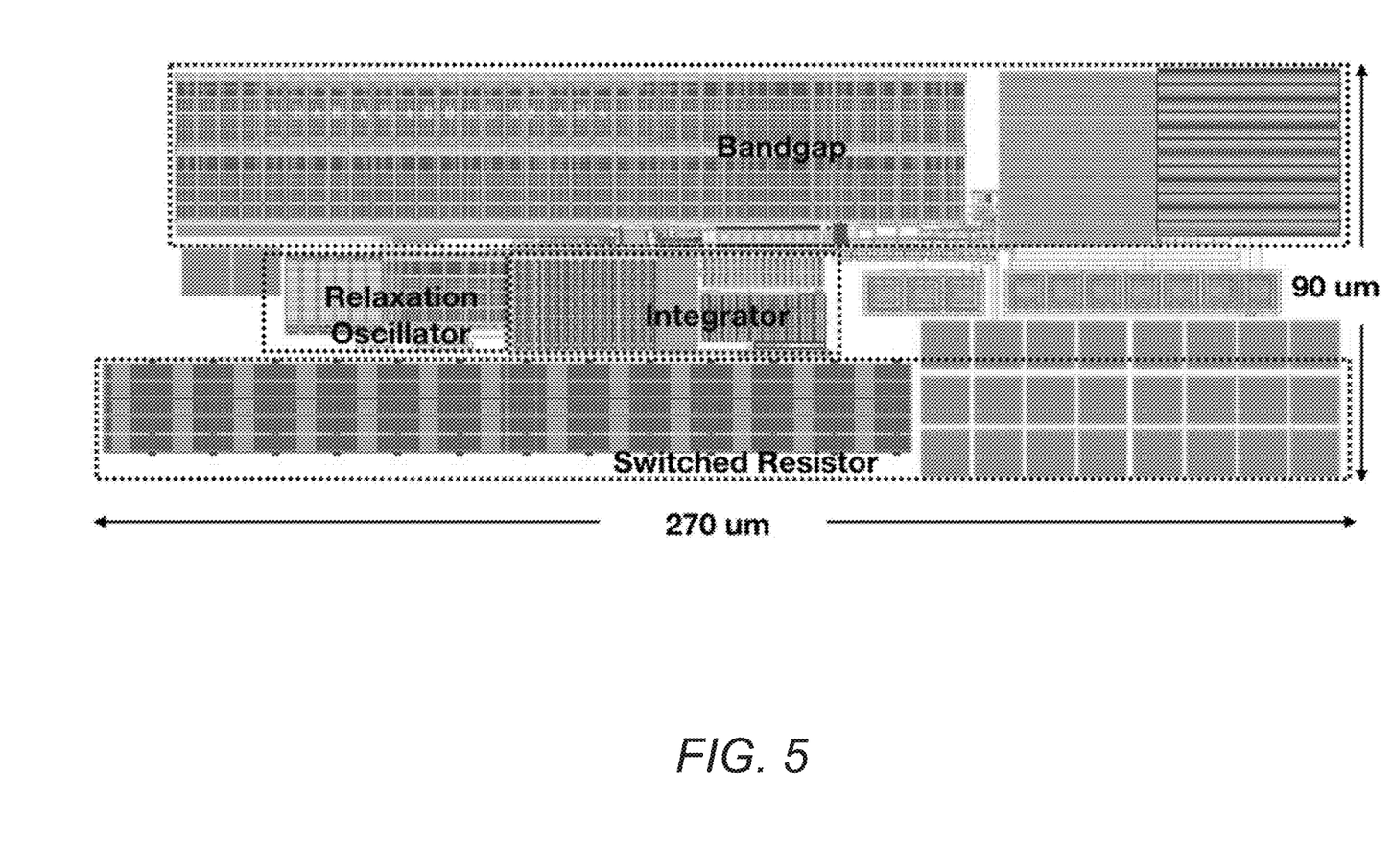
FIG. 5 illustrates a top-level layout of a CMOS frequency reference circuit with temperature coefficient cancellation in accordance with an embodiment of the invention.

Cadence circuit layout simulator can be utilized to simulate the performance of CMOS frequency reference circuits with temperature coefficient cancellation using extracted values for all circuit parameters. Cadence circuit layout of a CMOS frequency reference circuit with temperature coefficient cancellation is shown in FIG. 5. In the illustrated figure, the layout of a CMOS frequency reference circuit with temperature coefficient cancellation includes a bandgap, a relaxation oscillator, an integrator, and a switched-R circuit. In many embodiments, the layout of a CMOS frequency reference circuit with temperature coefficient cancellation can be fabricated in many fabrication process technologies (e.g. 28 nm CMOS process). Simulation results are discussed further below.

Figure 6:
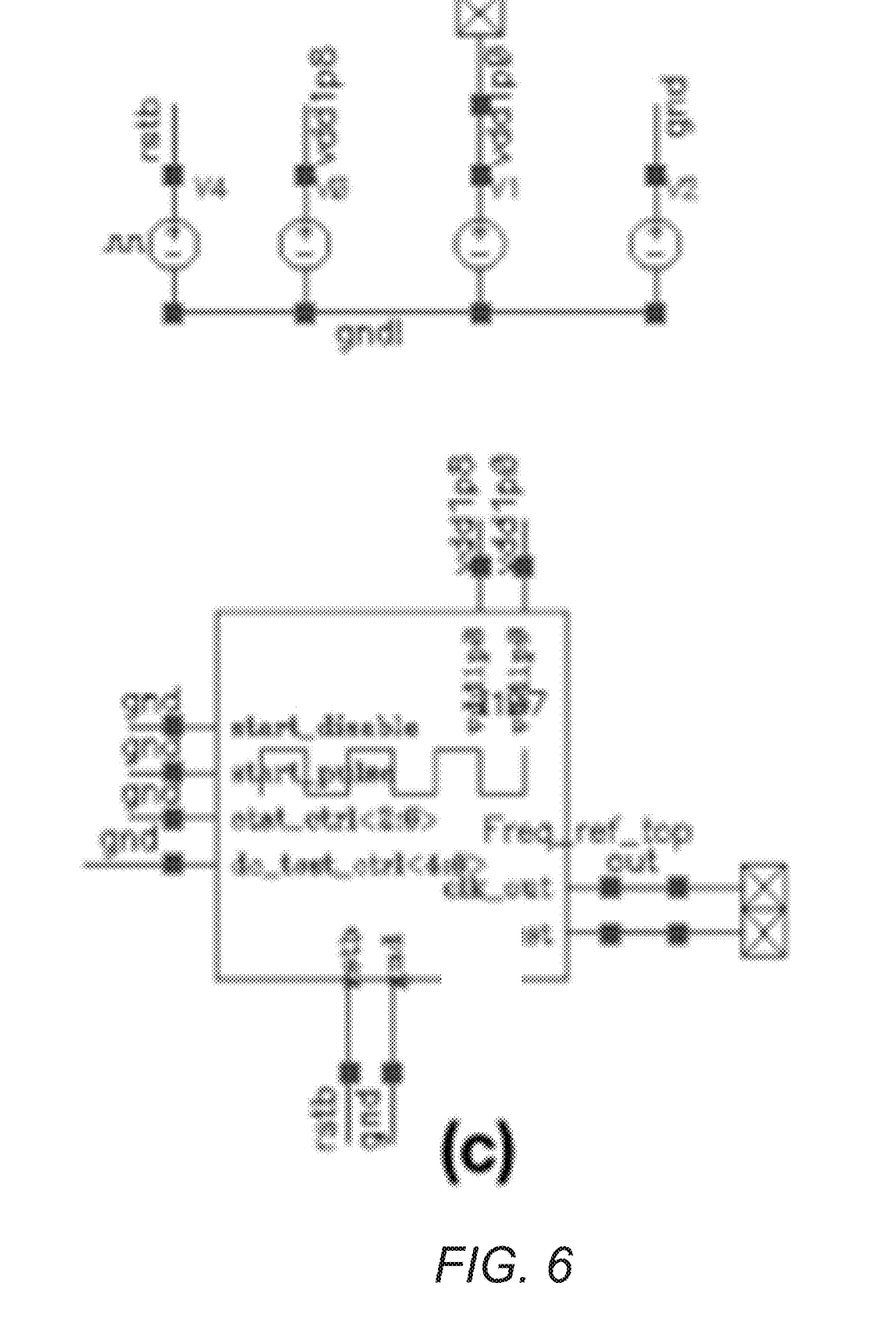
FIG. 6 shows a test bench schematic circuit of a CMOS frequency reference circuit with temperature coefficient cancellation in accordance with an embodiment of the invention.
Figure 7:
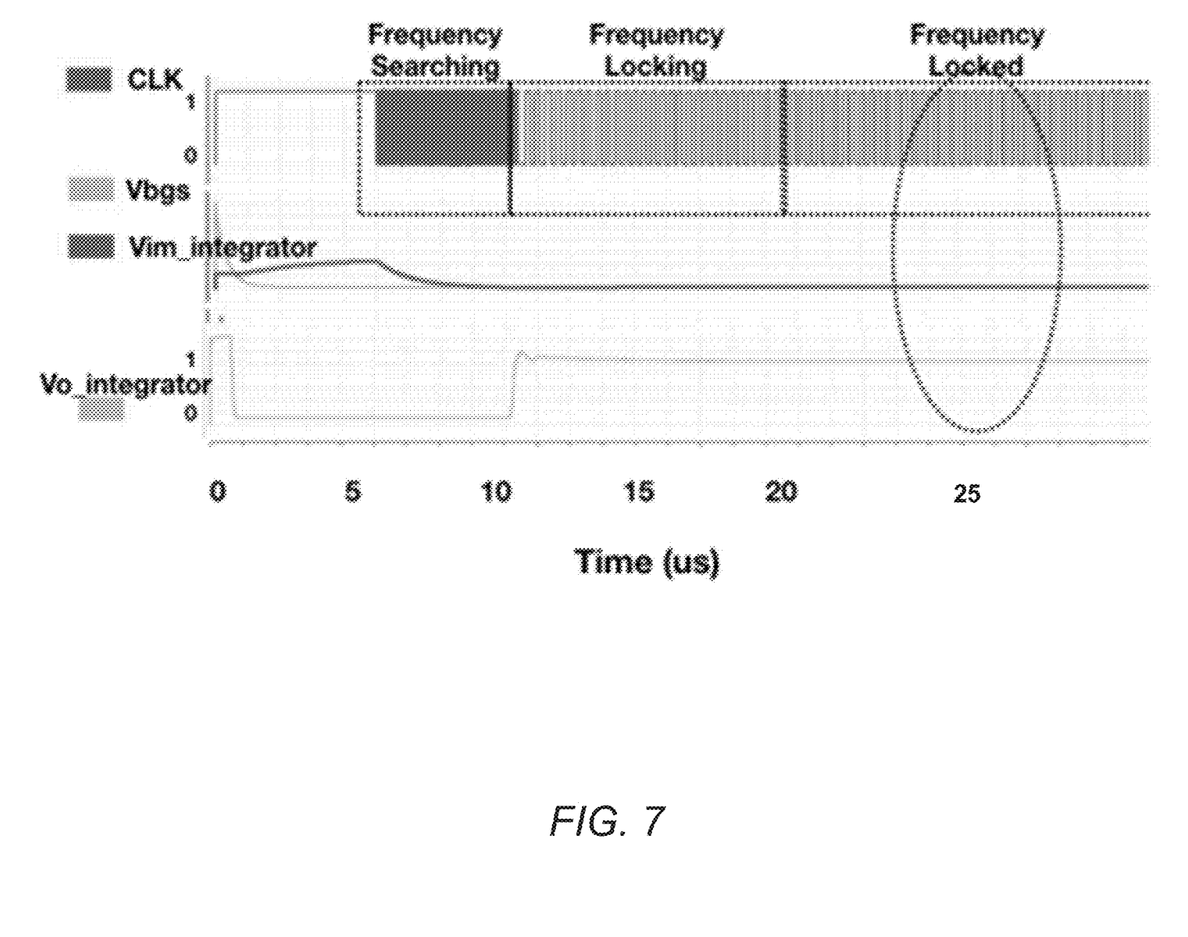
FIG. 7 shows results of simulations of a CMOS frequency reference circuit with temperature coefficient cancellation.
Figure 8:
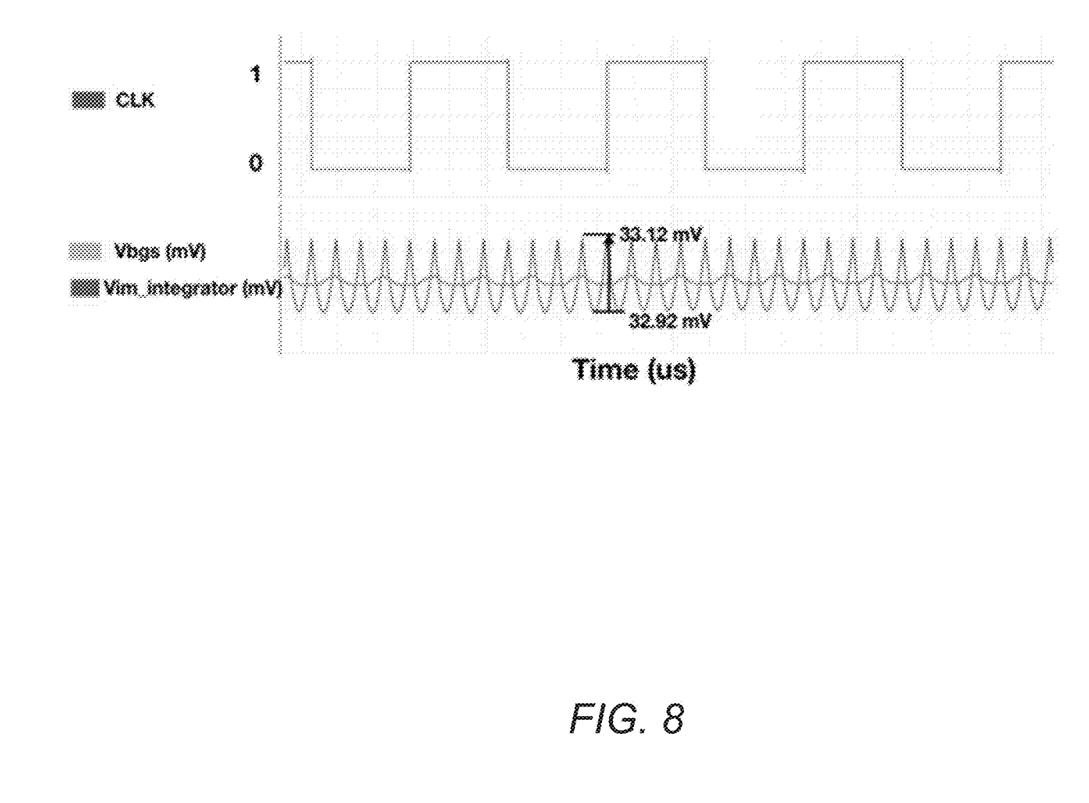
FIG. 8 shows zoomed in results of simulations of a CMOS frequency reference circuit with temperature coefficient cancellation.

Cadence circuit simulator can be utilized to simulate the performance of CMOS frequency reference circuits with temperature coefficient cancellation. Cadence simulation test circuit of a CMOS frequency reference circuit with temperature coefficient cancellation is shown in FIG. 6. In the illustrated figure, the CMOS frequency reference is shown along with power (Vdd) and ground nodes. The simulation results for the frequency reference of the circuit schematic of FIG. 6 are shown in FIG. 7. As shown in FIG. 7, an output clock of a CMOS frequency reference circuit with temperature coefficient cancellation circuit is plotted as a function of time. The CMOS frequency reference circuit with temperature coefficient cancellation circuit can achieve a locking of the output clock within a short period of time (e.g. 10 us). In FIG. 8, a zoomed-in plot of the output clock of FIG. 7 is shown for time around 25 us, where it can be seen a stable operation of the frequency reference.

Figure 9:
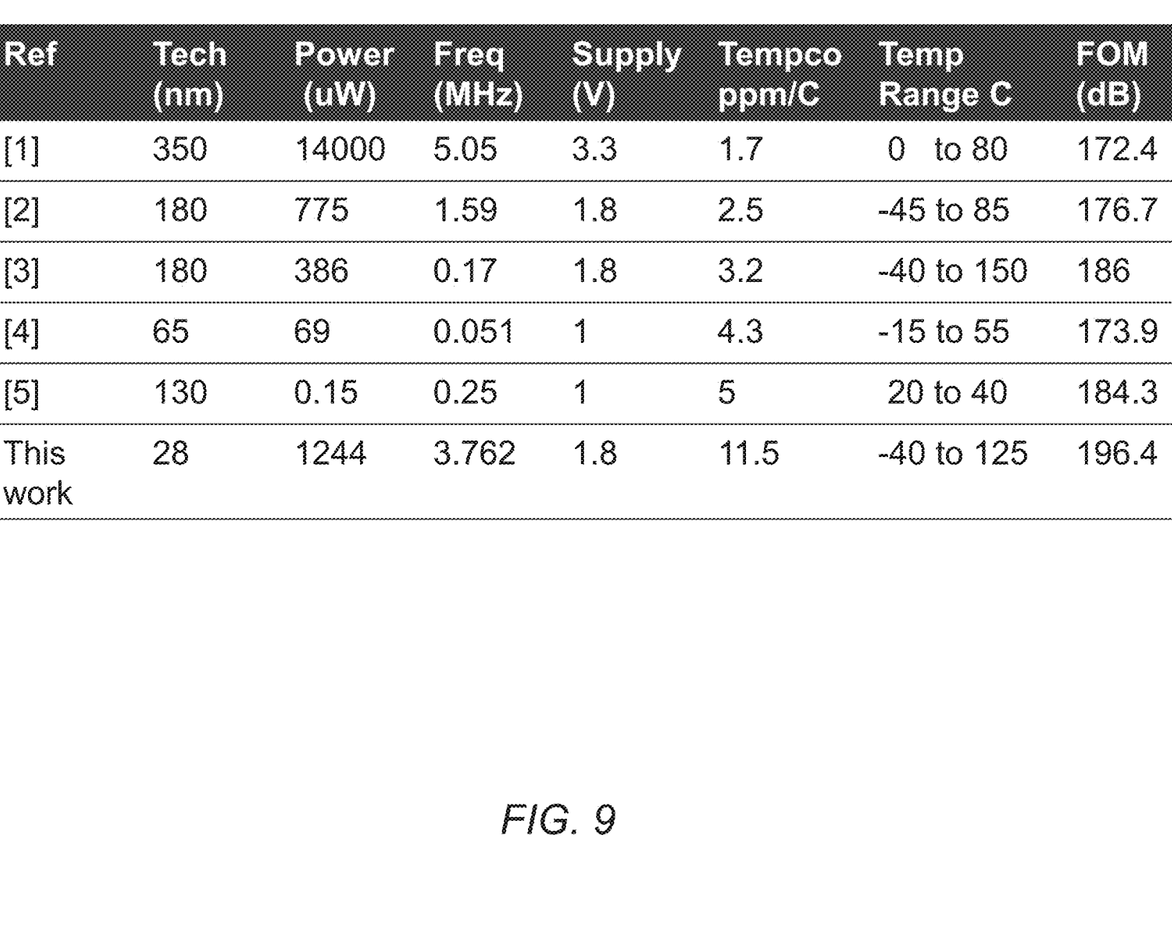
FIG. 9 illustrates performance of a CMOS frequency reference circuit with temperature coefficient cancellation in comparison to previously reported frequency references.

A CMOS frequency reference circuit with temperature coefficient cancellation can achieve a temperature coefficient of, for example, 12 ppm/° C. FIG. 9 table illustrates performance of a CMOS frequency reference circuit with temperature coefficient cancellation in accordance with an embodiment of the invention compared to previously reported frequency references. In the illustrated table, a figure-of-merit (FOM) of the various circuits is shown, where the FOM is defined as:

$$FOM = \frac{freq}{P_{DC} Tempco}$$

where freq is an operating frequency of the circuit, $P_{Dc}$ is a power consumption of the circuit, and Tempco is a temperature coefficient of the circuit.

While the above descriptions and associated figures have depicted a CMOS frequency reference circuit with temperature coefficient cancellation, it should be clear that any of a variety of configurations for CMOS frequency reference circuits with temperature coefficient cancellation can be implemented in accordance with embodiments of the invention. More generally, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. A frequency reference circuit, comprising:
    a bandgap proportional to temperature (PTAT) generator circuit that generates a bandgap PTAT current;
    a resistor complementary to temperature (CTAT) generator circuit that generates a resistor CTAT current;
    an adder that adds the PTAT current and the CTAT current to generate a constant current $I_{cons}$;
    a switched-resistor (switched-R) circuit that receives the constant current $I_{cons}$ and a previously generated output clock and generates an output;
    a bandgap voltage reference generator circuit that generates a bandgap voltage $V_{BG}$;
    an integrator circuit that receives the output of the switched-R circuit and the bandgap voltage $V_{BG}$ and generates an output; and
    a voltage-controlled oscillator (VCO) circuit that receives the output of the integrator circuit and generates a frequency reference.

2. The frequency reference circuit of claim 1, wherein the bandgap PTAT and resistor CTAT currents are given by:

$$I_{PTAT} = \frac{k \cdot T \cdot \ln(N)}{q \cdot R}, \quad I_{CTAT} = \frac{V_{BG}}{\beta R}$$

where β is ratio of resistors used in the bandgap PTAT generator circuit, N is ratio of areas of two bipolar transistors used in the bandgap PTAT generator circuit, k is Boltzmann constant, q is the charge of an electron and $V_{BG}$ is the bandgap voltage.

3. The frequency reference circuit of claim 1, wherein the bandgap PTAT current and the resistor CTAT currents are added together to generate the constant current $I_{cons}$ by:

$$I_{cons} = \frac{V_{BG}}{\beta \cdot R_0} \cdot \frac{1 + \frac{\beta \cdot k \cdot T \cdot \ln(N)}{q \cdot V_{BG}}}{1 + \alpha \cdot T}$$

such that the resistor temperature coefficient (α) is equated to $$\frac{\beta \cdot k \cdot \ln(N)}{q \cdot V_{BG}},$$

such that the current is constant with temperature, and wherein $I_{cons}$ is independent of process, voltage, and temperature variations.

4. The frequency reference circuit of claim 1, wherein the switch-R circuit further comprises two capacitors that are ping ponged at a frequency f that is generated by the VCO.

5. The frequency reference circuit of claim 4, wherein a voltage generated by the switched-R circuit is constantly compared with $V_{BG}$, and an error signal is generated and is integrated and fed as a control signal to the VCO, wherein the VCO frequency sweeps until the error signal reaches zero.

6. The frequency reference circuit of claim 5, wherein the frequency is given by:

$$f = \frac{1}{2 \cdot \beta \cdot R_0 \cdot C_{mos}}$$

wherein the frequency temperature coefficient depends on capacitor $C_{mos}$ temperature coefficient.

7. The frequency reference circuit of claim 1, wherein the bandgap voltage reference generator circuit includes an opamp.

8. The frequency reference circuit of claim 7, wherein a current mismatch error in a bandgap current mirror is addressed by Dynamic Element Matching.

9. A method of generating a reference frequency, comprising:
    generating a bandgap PTAT current using a bandgap proportional to temperature (PTAT) generator circuit;

generating a resistor CTAT current using a resistor complementary to temperature (CTAT) generator circuit;

adding the PTAT current and the CTAT current to generate a constant current $I_{cons}$ using an adder;

receiving the constant current $I_{cons}$ and a previously generated output clock and generating an output using a switched-resistor (switched-R);

generating a bandgap voltage $V_{BG}$ using a bandgap voltage reference generator;

receiving the output of the switched-R circuit and the bandgap voltage $V_{BG}$ and generating an output using an integrator circuit; and receiving the output of the integrator circuit and generating a frequency reference using a voltage-controlled oscillator (VCO) circuit.

10. The method of claim 9, wherein the bandgap PTAT and resistor CTAT currents are given by:

$$I_{PTAT} = \frac{k \cdot T \cdot \ln(N)}{q \cdot R}, I_{CTAT} = \frac{V_{BG}}{\beta R}$$

where $\beta$ is ratio of resistors used in the bandgap PTAT generator circuit, N is ratio of areas of two bipolar transistors used in the bandgap PTAT generator circuit, k is Boltzmann constant, q is the charge of an electron and $V_{BG}$ is the bandgap voltage.

11. The method of claim 9, wherein the bandgap PTAT current and the resistor CTAT currents are added together to generate the constant current $I_{cons}$ by:

$$I_{cons} = \frac{V_{BG}}{\beta \cdot R_0} \cdot \frac{1 + \frac{\beta \cdot k \cdot T \cdot \ln(N)}{q \cdot V_{BG}}}{1 + \alpha \cdot T}$$

such that the resistor temperature coefficient ($\alpha$) is equated to $$\frac{\beta \cdot k \cdot \ln(N)}{q \cdot V_{BG}},$$

such that the current is constant with temperature, and wherein $I_{cons}$ is independent of process, voltage, and temperature variations.

12. The method of claim 9, wherein the switch-R circuit further comprises two capacitors that are ping ponged at a frequency f that is generated by the VCO.

13. The method of claim 12, wherein a voltage generated by the switched-R circuit is constantly compared with $V_{BG}$, and an error signal is generated and is integrated and fed as a control signal to the VCO, wherein the VCO frequency sweeps until the error signal reaches zero.

14. The method of claim 13, wherein the frequency is given by:

$$f = \frac{1}{2 \cdot \beta \cdot R_0 \cdot C_{mos}}$$

wherein the frequency temperature coefficient depends on capacitor $C_{mos}$ temperature coefficient.

15. The method of claim 9, wherein the bandgap voltage reference generator circuit includes an opamp.

16. The method of claim 15, wherein a current mismatch error in a bandgap current mirror is addressed by Dynamic Element Matching.

* * * * *